United States Patent
Mochida et al.

(10) Patent No.: US 6,305,594 B1
(45) Date of Patent: Oct. 23, 2001

(54) WIRE BONDING METHOD AND APPARATUS

(75) Inventors: Toru Mochida, Higashiyamato; Shinichi Nishiura, Fussa, both of (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/503,427

(22) Filed: Feb. 14, 2000

Related U.S. Application Data

(62) Division of application No. 09/221,066, filed on Dec. 28, 1998, now Pat. No. 6,164,518.

(30) Foreign Application Priority Data

Dec. 25, 1997 (JP) .................................................... 9-367440

(51) Int. Cl.[7] .............................. B23K 37/00; B23K 31/02
(52) U.S. Cl. .............................. 228/4.5; 228/8; 228/180.5
(58) Field of Search ................................ 228/105, 1.1, 8, 228/9, 10, 4.5, 110.1, 180.5, 102, 103

(56) References Cited

U.S. PATENT DOCUMENTS

| | | | |
|---|---|---|---|
| 4,327,860 | * | 5/1982 | Kirshenboin et al. . |
| 4,340,166 | * | 7/1982 | Bilane et al. . |
| 4,444,349 | * | 4/1984 | Bilane et al. . |
| 4,555,052 | * | 11/1985 | Kurtz et al. . |
| 4,572,421 | * | 2/1986 | Hug et al. . |
| 4,597,519 | * | 7/1986 | Kurtz et al. . |
| 4,878,609 | * | 11/1989 | Farassat . |
| 5,011,061 | * | 4/1991 | Funatsu . |
| 5,037,023 | * | 8/1991 | Akiyama et al. . |
| 5,190,206 | * | 3/1993 | Miller et al. . |
| 5,323,952 | * | 6/1994 | Kato et al. . |
| 5,443,200 | * | 8/1995 | Arikado . |
| 5,583,756 | * | 12/1996 | Sasano . |
| 5,586,713 | * | 12/1996 | Arita et al. . |
| 5,615,821 | * | 4/1997 | Sasano . |
| 5,862,974 | * | 1/1999 | Sasano . |
| 6,070,778 | * | 6/2000 | Takahashi et al. . |
| 6,095,396 | * | 8/2000 | Takahashi et al. . |
| 6,119,914 | * | 9/2000 | Takahashi et al. . |
| 6,119,917 | * | 9/2000 | Takahashi et al. . |
| 6,164,514 | * | 12/2000 | Miller . |

\* cited by examiner

*Primary Examiner*—Tom Dunn
*Assistant Examiner*—Kiley Stoner
(74) *Attorney, Agent, or Firm*—Koda & Androlia

(57) ABSTRACT

So as to obtain constant heights and shapes of a plurality of loops of bonded wires regardless of the position on the semiconductor chip where bonding is performed, the height position of a bonding tool at a bonding point when the first wire is bonded between first and second boding points is taken as a reference bonding position; and during the looping for the remaining wires, the bonding tool is moved in accordance with an amount of movement stored beforehand in the memory with the reference bonding position used as a reference.

2 Claims, 7 Drawing Sheets

(a)

(b)

(c)

(a)

(b)

(c)

(a)

(b)

(c)

(a)

(b)

(c)

WIRE BONDING METHOD AND APPARATUS

This is a Divisional Application of application Ser. No. 09/221,066, filed Dec. 28, 1998 now U.S. Pat. No. 6,164,518.

BACKGROUND OF THE INVENTION

1. Field of the Invention

The present invention relates to a wire bonding method and apparatus.

2. Prior Art

As universally known, in a wire bonding apparatus, a bonding head is mounted on an XY table, and this XY table is driven in the directions of the X and Y axes (two perpendicular directions on the horizontal plane) by means of an XY-axis motor (hereafter referred to as XY-axis driving). An ultrasonic horn which is raised and lowered or pivoted upward and downward by a Zaxis motor (hereafter referred to as Z-axis driving) is disposed on the bonding head with a bonding tool attached to one end of the ultrasonic horn. A wire wound on a wire spool passes through the bonding tool via a clamper.

Wire bonding is performed at the bonding timing shown in FIG. 4.

In particular, as a result of horizontal-plane movement of the bonding head (which makes a horizontal-plane movement of the bonding tool) by the X-Y-axis driving of the XY table and lowering movement of the ultrasonic horn by the Z-axis driving, the bonding tool is lowered so that a ball formed on the tip of the wire contacts the first bonding point 1. The bonding tool is then slightly lowered even further so that the ball at the tip of the wire is pressed against the first bonding point 1. While the ball is being pressed, the ultrasonic horn performs an ultrasonic oscillation so that an ultrasonic vibration is applied to the bonding tool, thus bonding the ball to the first bonding point 1.

Next, the bonding tool is raised to the height level C, which is vertically an intermediate point, driven in the directions of the X and Y axes and lowered, delivering the wire. The wire is then brought so as to contact the second bonding point 2, and ultrasonic vibration and the application of pressure to a portion of the wire are performed in the same manner as done in the step of bonding of the first bonding point 1, thus bonding the wire to the second bonding point 2. Afterward, the bonding tool is raised, and the clamper is closed during this raising process of the bonding tool, thus cutting the wire from the second bonding point 2.

Conventionally, in the raising operation of the bonding tool to an intermediate position C after the bonding to the first bonding point 1, the Z-position of the bonding tool at the time that the bonding tool bonds the ball to the first bonding point 1 is used as a reference position, and the intermediate position C is calculated by performing mathematical operations on this reference position and the raising amount of the bonding tool based on looping parameters stored in the memory beforehand. Afterward, a looping operation is performed by the XY-axis driving simultaneously with the raising of the bonding tool by the Z-axis driving.

Wire bonding methods described above are described in, for example, Japanese Patent Application Publication (Kokoku) No. H1-31695 and Japanese Patent No. 2530224.

However, in semiconductor devices, the amount of sinking-in caused by the pressing force of the bonding tool is not always necessarily uniform, and it differs from bonding point to bonding point. Furthermore, when the bonding tool is raised for looping (or loop formation) so that the pressing of the bonding tool is eliminated, the bonding tool may return to the pre-sinking-in position (i.e., the bonding tool bounds) in some cases. CSP's (chip scale packages) may be cited as an example of such semiconductor devices.

In such a CSP, as shown in FIG. 5, a plastic insulating sheet 6 is bonded to a tape 5 on which a wiring pattern 4 is formed, and a semiconductor chip 8 is fastened to the surface of this plastic insulating sheet 6 via a paste 7. If the paste 7 is applied directly to the wiring pattern 4 on the tape 5, since the paste 7 is conductive, the wiring pattern 4 will short out. Accordingly, an insulating sheet 6 is bonded between the tape 5 and paste 7.

Such insulating sheets 6 include thermosetting sheets. However, since the insulating sheet 6 is generally softer than the cured paste 7, some sinking-in of the bonding points on the semiconductor chip 8 occurs when the bonding tool presses the semiconductor chip during bonding. Furthermore, in order to prevent the paste 7 from being squeezed out onto the tape 5, the paste 7 is applied in an area that is smaller than the semiconductor chip 8; however, such a paste 7 forms gaps 12 at the ends of the semiconductor chip 8, thus causing the sinking-in to occur.

FIG. 6 shows the sinking-in positions Sn and amounts of sinking-in ΔSn of the bonding points Pn caused by the pressing of the bonding tool 10 when the bonding tool 10 bonds the wire to the bonding points Pn on the semiconductor chip 8. In FIG. 6, n indicates the number of bonding points (natural number).

FIG. 7 shows how an insulating sheet 6 is present on the semiconductor device 1 in conventional wire bonding, and how deformation of the insulating sheet 6 caused by the pressing of the bonding tool 10 is translated into the amount of sinking-in ΔSn of the bonding points Pn on the semiconductor chip 8.

FIG. 7(a) shows the sinking-in of a bonding point $P_1$ located on the central portion of the semiconductor chip 8 during bonding to said bonding point $P_1$, FIG. 7(b) shows the sinking-in of a bonding point $P_2$ located on the end portion of the semiconductor chip 8 during bonding to the bonding point $P_2$, and FIG. 7(c) shows the raising of the bonding tool 10 to the intermediate positions $C_1$ and $C_2$ that correspond to the intermediate position C in FIG. 4 in the respective cases of FIGS. 7(a) and 7(b).

Furthermore, $S_0$ indicated by a two-dot chain line represents the bonding position of the bonding tool 10 at the respective bonding points Pn after the bonding tool 10 has bonded the wire to the bonding points Pn of the semiconductor chip 8. The amounts of sinking-in $\Delta S_1$ and $\Delta S_2$ are exaggerated in FIG. 7 in order to facilitate understanding. The amount of sinking-in $\Delta S_1$ is approximately 5 microns ($\mu$m), and the amount of sinking-in $\Delta S_2$ is approximately 25 microns.

The amount of sinking-in $\Delta S_2$ of the end-portion bonding point $P_2$ shown in FIG. 7(b) is larger than the amount of sinking-in $\Delta S_1$ of the central-portion bonding point $P_1$ shown in FIG. 7(a). As shown in FIG. 7(c), when the bonding tool 10 is raised so that the pressing force exerted on the bonding points Pn by the bonding tool 10 is eliminated, the Z position of the respective bonding points Pn returns to the original Z position $S_0$. Here, in the case of FIG. 7(a) in which the bonding point $P_1$ is located on the central portion of the semiconductor chip 8, the bonding tool 10 is raised by a fixed amount $\Delta H_0$ from the sinking-in Z position $S_1$ and positioned at the intermediate position $C_1$; and in the case of FIG. 7(b) where the bonding point $P_2$ is located on the end portion of the semiconductor chip 8, the bonding tool 10 is raised by a fixed amount $\Delta H_0$ from the sinking-in Z position $S_2$ and positioned at the intermediate position $C_2$. In other words, in the case of FIG. 7(a), the bonding tool 10 is raised by $\Delta H_1$, which is lower than the original Z position $S_0$ by an amount corresponding to the sinking-in amount $\Delta S_1$; and in the case of FIG. 7(b), the bonding tool 10 is raised by $\Delta H_2$, which is lower than the original Z position $S_0$ by an amount corresponding to the sinking-in amount $\Delta S_2$. Accordingly, in the case of FIG. 7(b), the amount by which the bonding tool 10 is raised is smaller than in the case of FIG. 7(a) by $\Delta S = \Delta S_2 - \Delta S_1$.

Furthermore, in cases where no insulating sheet 6 is provided, as shown in FIG. 8, if the tape 5 is pliable, and the paste 7 is applied in an area smaller than the semiconductor chip 8, then the problems as described above occur. More specifically, when bonding is performed on the central-portion point $P_1$ shown in FIG. 8(a), the amount of sinking-in $\Delta S_1$ is the same as in a case where an insulating sheet 6 is used. However, when bonding is performed on the end-portion bonding point $P_2$ shown in FIG. 8(b), since a gap 12 exists (since no paste 7 is used beneath the semiconductor chip 8), the portion 5a of the tape 5 located on the opposite side from the bonding tool 10 is lifted by the pressing action of the bonding tool 10, so that an amount of sinking-in $\Delta S t$ is generated.

Accordingly, when the bonding tool 10 is raised after bonding, and the application of pressure is eliminated as shown in FIG. 8(c), the amount by which the bonding tool 10 is raised is smaller in the case of FIG. 8(b) than in the case of FIG. 8(a) by a sinking-in amount $\Delta S t$.

Furthermore, as shown in FIG. 9 as another case, if a semiconductor device is structured so that a semiconductor chip 8 is fastened to the surface of a substrate 15 via paste 7, the substrate 15 deforms when it is heated by a heating block 14 that is equipped with a heater 13, etc. As a result, when the bonding tool 10 applies pressure to the end-portion bonding point $P_2$ on such a semiconductor chip 8, a sinking-in amount $\Delta S s$ is generated because of the deformed portion 15a of the substrate 15. In this case as well, the amount by which the bonding tool 10 is raised following bonding is reduced by the sinking-in amount $\Delta S s$.

As seen from the above, the Z position of the bonding tool when the bonding tool bonds the ball to the bonding point is used as a reference position, and the bonding tool is raised after the raising amount of the bonding tool is calculated based upon this reference position and looping parameters stored in the memory beforehand. Accordingly, the height of the loop and the loop shape tend to differ for each bonding point.

SUMMARY OF THE INVENTION

Accordingly, the object of the present invention is to provide a wire bonding method and apparatus which can make a constant loop height and loop shape regardless of the position on the semiconductor chip where bonding is performed.

The wire bonding method of the present invention for accomplishing the object is characterized in that in a wire bonding method for connecting a first bonding point and a second bonding point with a wire so as to form a wire loop in between, the height position of the bonding tool at the time of bonding (or looping) of the first wire is selected as a reference bonding position, and during the looping of the remaining wires, the bonding tool is moved in accordance with a movement amount that is stored beforehand in a memory using the reference bonding position as a reference.

Another wire bonding method of the present invention for accomplishing the object is characterized in that in a wire bonding method in which a first bonding point and a second bonding point are connected by a wire so as to make a wire loop in between, the bonding tool is caused to contact an arbitrary portion of the semiconductor device, and the position of the bonding tool at this time is used as a reference bonding position; and, during the looping operation (or bonding operation) of the subsequent wires, the bonding tool is moved in accordance with a movement amount that is stored beforehand in a memory using the reference bonding position as a reference.

In other words, in the method of the present invention, in which a plurality of pairs of first and second bonding points are connected by a wire, which passes through a tool, so as to provide a wire loop between each one of said pairs of first and second bonding points, a height position of a bonding tool at the time of bonding of a first wire to a first pair of first and second bonding points for providing a wire loop between the first pair of first and second bonding points is used as a reference bonding position; and during bonding for remaining pairs of first and second bonding points for providing wire loops for such remaining pairs of first and second bonding points, the bonding tool is moved according to a movement amount that is stored beforehand in a memory using said reference bonding position as a reference.

Furthermore, the above object is accomplished by a unique structure for a wire bonding apparatus that comprises a Z-axis motor for raising and lowering a bonding tool through which a wire is passed, and a motor controller which outputs commands for driving the Z-axis motor, so that a first bonding point and a second bonding point on a semiconductor chip are connected by a wire so as to make a loop in between; and the apparatus of the present invention is characterized in that the bonding apparatus further comprises: a bonding position detection sensor which inputs the positions of the bonding points; a memory which stores a plurality of bonding positions and other information such as Z-axis driving data, etc.; a Z-position operational processor which calculates the amount of movement of the bonding tool from the bonding position used as a reference among the plurality of bonding positions and other information stored in the memory; and a main controller which controls the Z-axis motor controller on the basis of the amount of movement of the bonding tool from the Z-position operational processor.

BRIEF DESCRIPTION OF THE DRAWINGS

FIG. 2 illustrates one embodiment of the wire bonding method of the present invention, in which FIG. 2(a) shows the sinking-in of a central-portion bonding point, FIG. 2(b) shows the sinking-in of an end-portion bonding point, and FIG. 2(c) shows the raising of the bonding tool in the cases of FIGS. 2(a) and 2(b).

FIG. 3 illustrates another embodiment of the wire bonding method of the present invention, in which FIG. 3(a) shows the sinking-in of a central-portion bonding point, FIG. 3(b) shows the sinking-in of an end-portion bonding point, and FIG. 3(c) shows the raising of the bonding tool in the cases of FIGS. 3(a) and 3(b);

FIG. 5 illustrates one example of a semiconductor device in which sinking-in of the bonding points on the semiconductor chip occurs, wherein FIG. 5(a) is a side view thereof, and FIG. 5(b) is a top view thereof;

FIG. 7 illustrates a conventional wire bonding method, in which FIG. 7(a) shows the sinking-in of a central-portion bonding point, FIG. 7(b) shows the sinking-in of an end-portion bonding point, and FIG. 7(c) shows the raising of the bonding tool in the cases of FIGS. 7(a) and 7(b);

FIG. 8 illustrates another example of a semiconductor device of prior art in which the sinking-in of bonding points on the semiconductor chip occurs, in which FIG. 8(a) shows the sinking-in of a central-portion bonding point, FIG. 8(b) shows the sinking-in of an end-portion bonding point, and FIG. 8(c) shows the raising of the bonding tool in the cases of FIGS. 8(a) and 8(b)

DETAILED DESCRIPTION OF THE PREFERRED EMBODIMENTS

One embodiment of the present invention will be described with reference to FIGS. 1 and 2. Constituting elements which are the same as in FIG. 7, or which correspond to those in FIG. 7, will be labeled with the same symbols.

Figure 1:
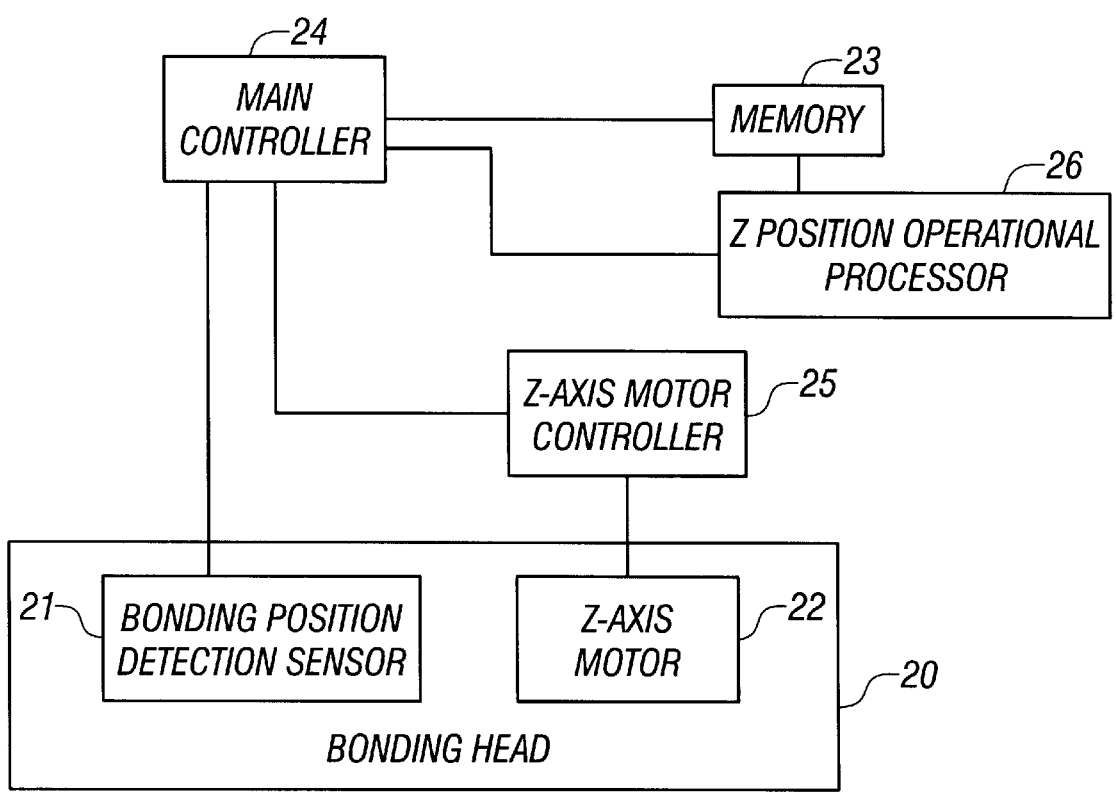
FIG. 1 is a block diagram of the control circuit relationship used in the wire bonding method and apparatus of the present invention.
Figure 2:
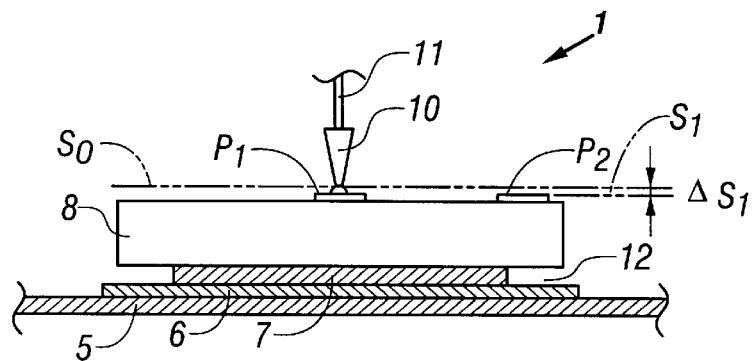
Figure 2:
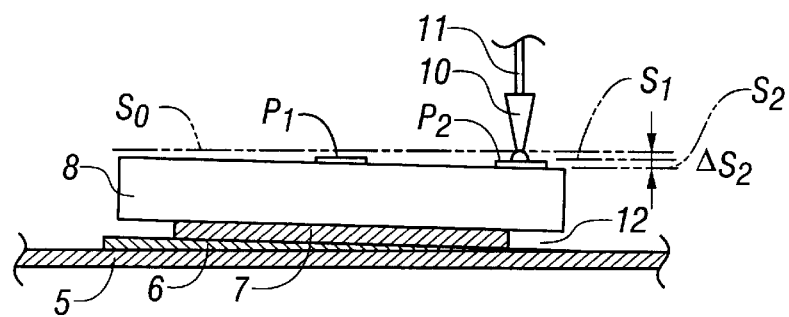
Figure 2:
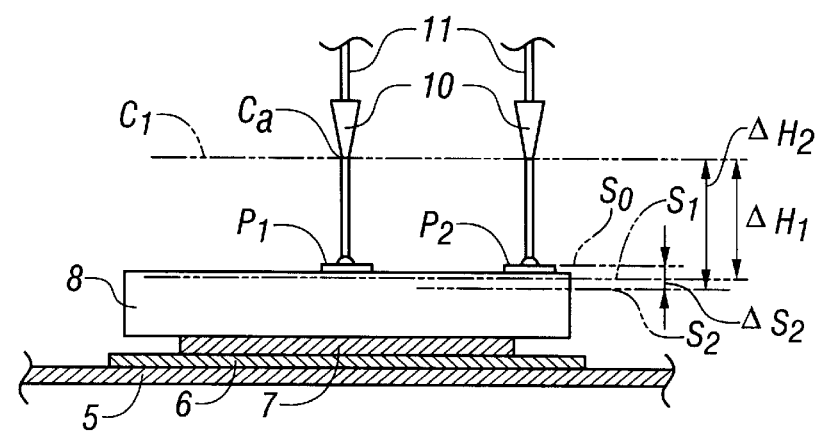

As seen from FIG. 1, a bonding position detection sensor 21 and a Z-axis motor 22 which drives the bonding tool 10 shown in FIG. 2 upward and downward are attached to a bonding head 20. Bonding information including Z-axis driving data which operates the Z-axis motor 22, looping data, bonding points, etc. are stored in the memory 23. The Z-axis motor 22 is driven by a main controller 24 via a Z-axis motor controller 25 on the basis of this Z-axis driving data. Furthermore, the intermediate position C (of the bonding tool 10) used for looping is calculated by a Z-position operational processor 26 on the basis of the above-described looping data.

Bonding position detection (or calculation) methods using a bonding position detection sensor 21 are described, for example, in Japanese Patent Application Publication (Kokoku) No. H1-31695 and Japanese Patent Application Laid-Open (Kokai) No. H4-352336.

FIG. 2 illustrates a case in which the first wire is bonded to a bonding point $P_1$ in the central portion of the row of bonding points, and in which the wires from the second and the following wires are successively bonded toward an end-portion bonding point $P_2$ following the completion of the bonding of the first wire, in accordance with the present invention.

As seen from FIGS. 1 and 2, based upon Z-axis driving data stored in the memory 23, the Z-axis motor 22 is driven by the main controller 24 via the Z-axis motor controller 25, so that the bonding tool 10 is raised and lowered. When the bonding tool 10 is lowered as shown in FIG. 2(a), and bonding is performed on the bonding point $P_1$, the Z position of the bonding point in this case (sinking-in Z position $S_1$) is detected by the bonding position detection sensor 21. The Z position in this case, i.e., the sinking-in Z position $S_1$, is read in as the reference bonding position $S_1$ and is stored in the memory 23.

Figure 7:
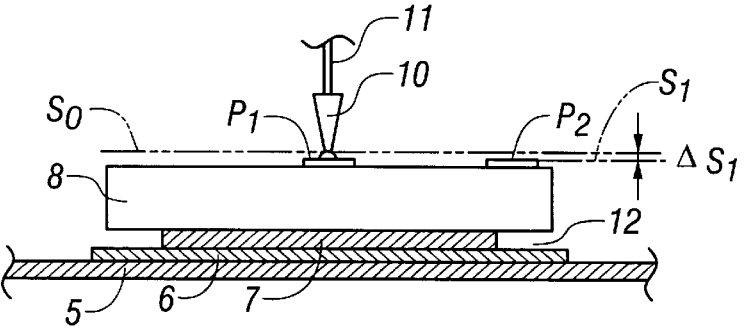
Figure 7:
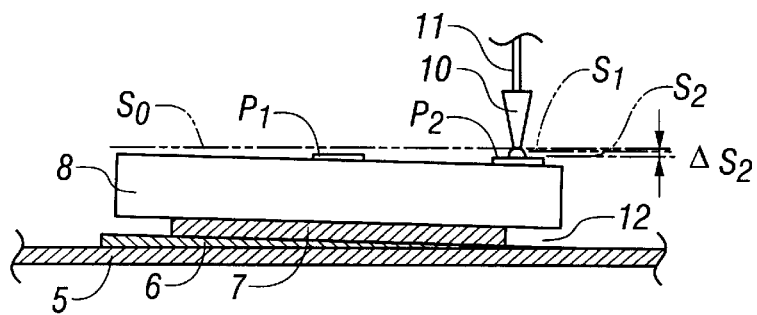
Figure 7:
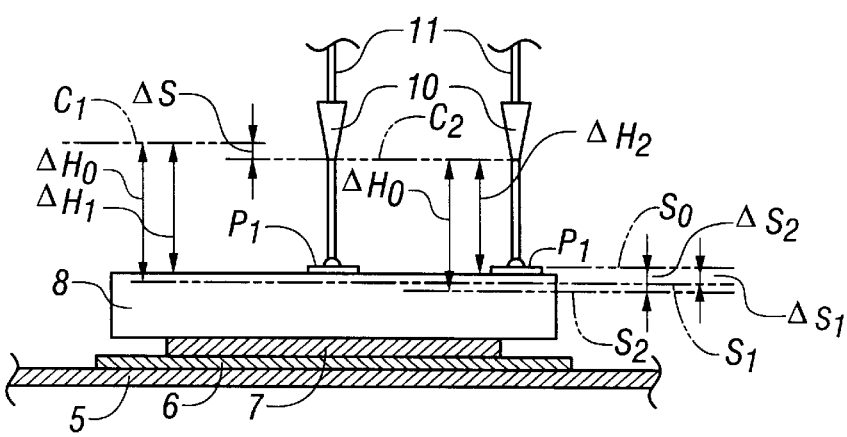

When bonding to the bonding point $P_1$ is completed, the raised position $C_1$. and the raising amount $\Delta H_1$ used for looping are calculated by the Z position operational processor 26 based upon the looping parameters stored in the memory 23 beforehand, using the above-described reference bonding position $S_1$ stored in the memory 23 as a reference. Here, as shown in FIG. 7, the raising amount $\Delta H_1$ is an added amount of the sinking-in amount $\Delta S_1$ and the fixed amount $\Delta H_0$. The bonding tool 10 is raised by this raising amount $\Delta H_1$ and is positioned in the intermediate position $C_1$. Afterward, using a universally known method, the bonding tool 10 is moved to the second bonding point and performs bonding, and then the wire 11 is cut from the second bonding point.

Afterward, following bonding to the bonding points Pn from the second wire on, the bonding tool 10 is raised as follows: i.e., using the reference bonding position $S_1$ stored in the memory 23 as a reference, the bonding tool 10 is raised by an amount $\Delta Hn$ which is obtained by adding the raising amount $\Delta H_1$ to the difference $\Delta S$ between the sinking-in amount $\Delta S_1$ at this reference bonding position $S_1$ and the sinking-in amount $\Delta Sn$ at the bonding points Pn from the second wire on. For example, in the case of bonding to the end-portion bonding point $P_2$, as shown in FIG. 2(b), the bonding tool 10 is raised (following bonding to the bonding point $P_2$) by a raising amount $\Delta H_2$ obtained by adding the raising amount $\Delta H_1$ to the difference $\Delta S$ on the basis of looping parameters stored beforehand in the memory 23, using the reference bonding position $S_1$ stored in the memory 23 as a reference. In other words, the sinking-in amount in this case is $\Delta S_2$ and the bonding tool is raised from the sinking-in Z position $S_2$; accordingly, the raising amount $\Delta H_2$ from the sinking-in Z position $S_2$ is $\Delta H_2 = \Delta H_1 + \Delta S_2$ as shown in FIG. 2(c). Subsequently, the raising amount $\Delta Hn$ of the bonding tool 10 following the bonding of the nth wire to bonding point Pn is $\Delta Hn = \Delta H_1 + \Delta Sn$.

Thus, since the bonding tool is raised using the sinking-in Z position $S_1$ of the bonding point $P_1$ of the first wire (i.e., the first bonding point) as a reference bonding position $S_1$, when the bonding tool 10 is raised so that the application of pressure by the bonding tool 10 is eliminated and the bonding point on the semiconductor chip 8 returns to the pre-sinking-in position $S_0$ as shown in FIG. 2(c), the raised position of the bonding tool 10 which is raised from the bonding point for looping will always be the same position Ca regardless of the bonding point As a result, the same loop height and shape can be obtained at all of the bonding points.

Figure 3:
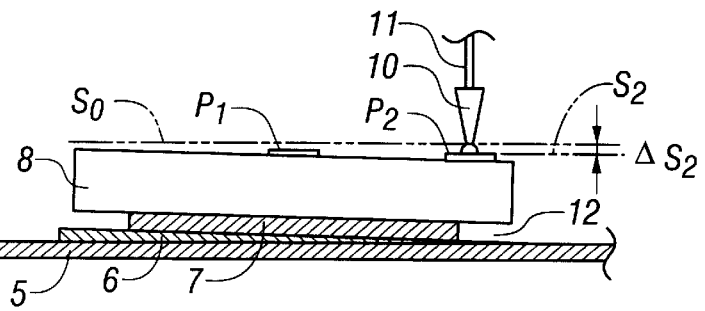
Figure 3:
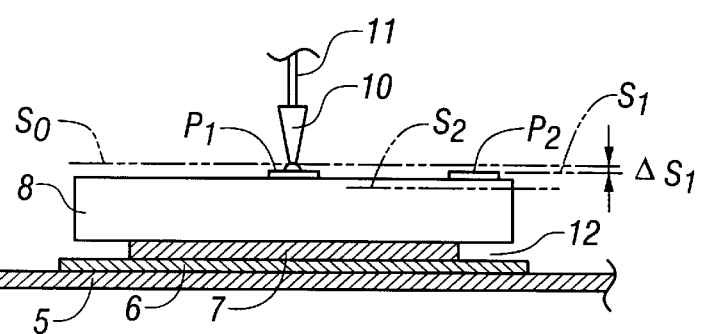
Figure 3:
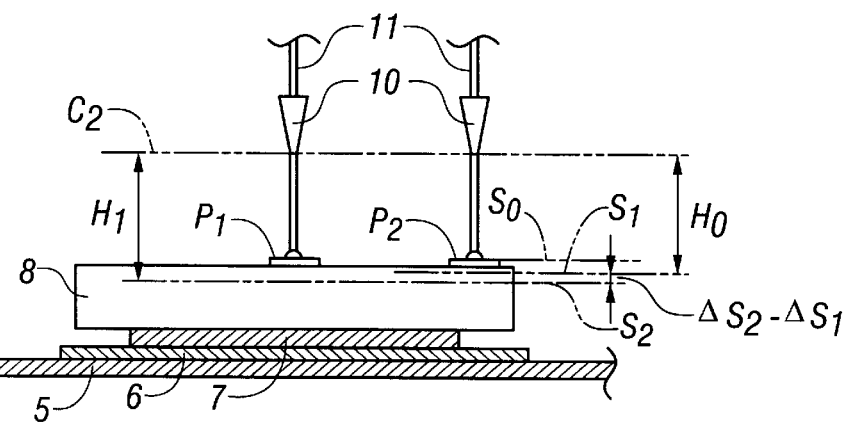
Figure 4:
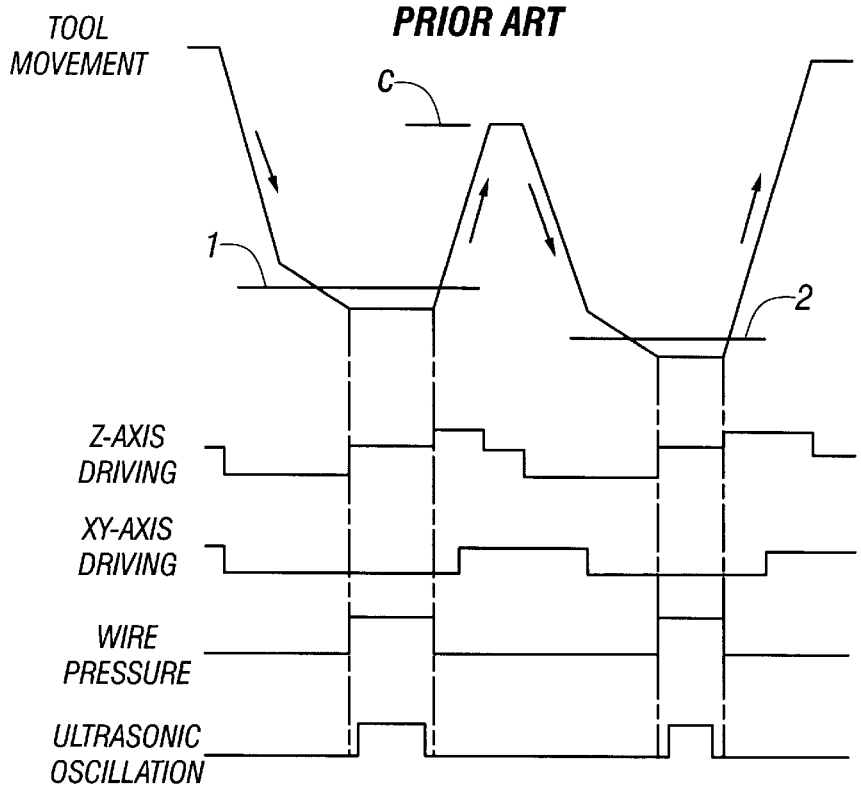
FIG. 4 is an optional timing chart used in the wire bonding method and apparatus of the present invention.
Figure 5:
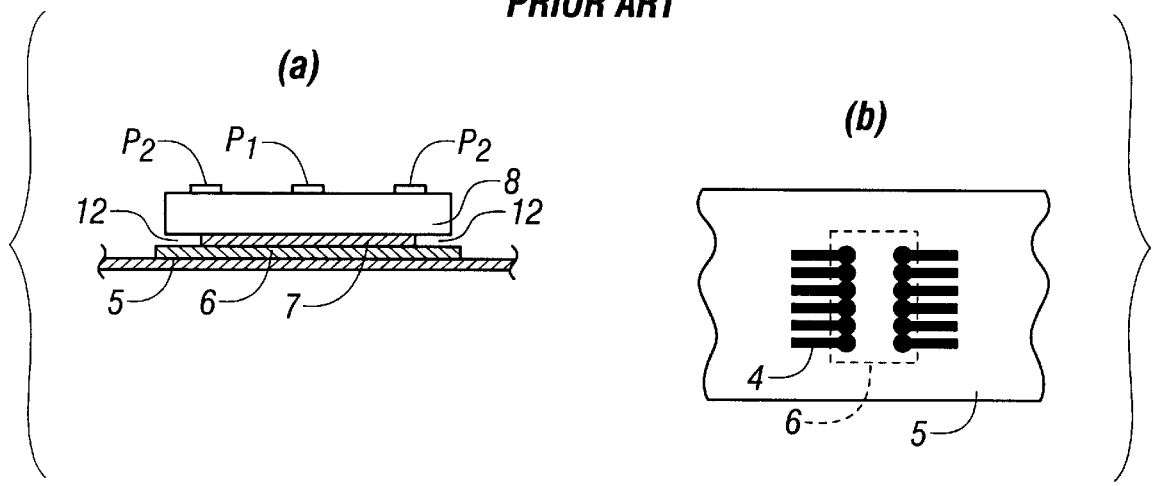
Figure 6:
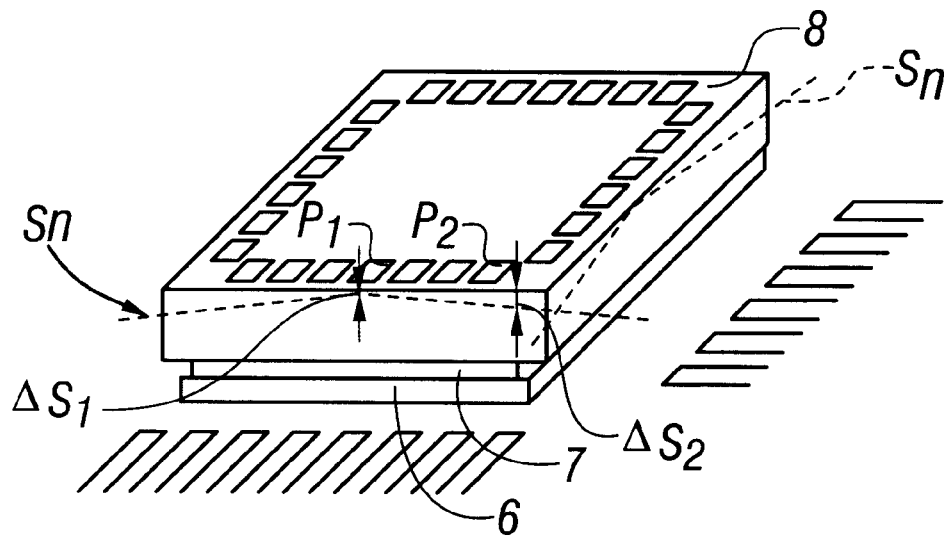
FIG. 6 is an explanatory diagram which shows variation in the sinking-in of the bonding points on the semiconductor chip.
Figure 9:
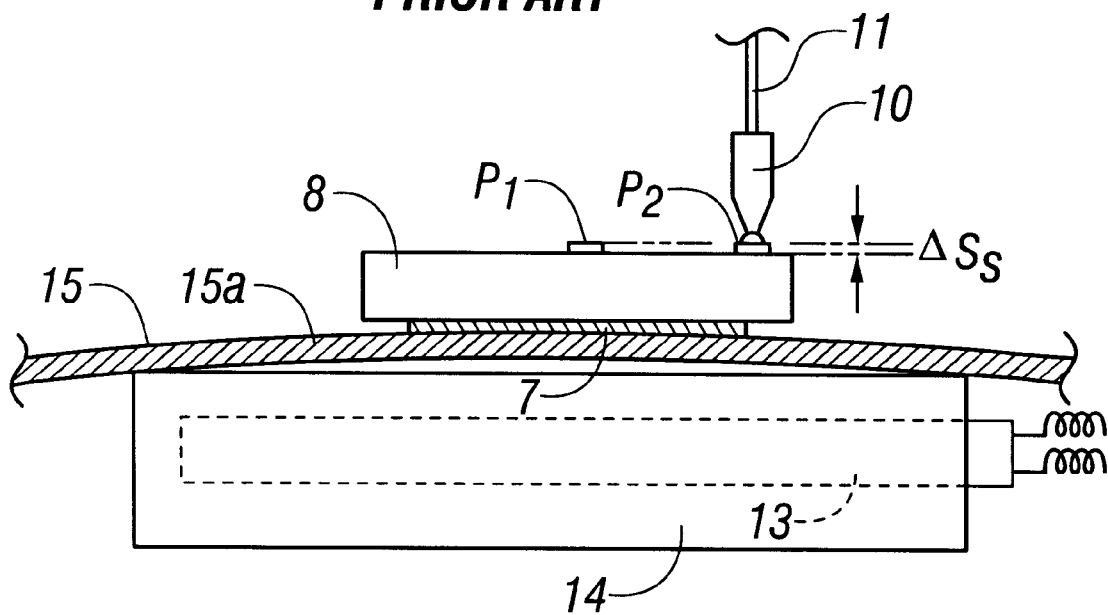
FIG. 9 is an enlarged illustration showing the variation in the sinking-in of the bonding points on the semiconductor chip in a case where the tape is heated.

FIG. 3 shows another embodiment of the present invention in which the first wire is bonded to the end-portion bonding point $P_2$.

In a case where the end-portion bonding point $P_2$ is used for the first wire, the amount of sinking-in $\Delta S_2$ caused by the pressing of the bonding tool 10 is greater than the amount of sinking-in in the case of bonding to the central-portion bonding point $P_1$; accordingly, as shown in FIG. 3(c), the raising amount $\Delta H_2$ by which the bonding tool is raised following bonding to the bonding point $P_2$ is greater than the above-described raising amount $\Delta H_1$ by an amount equal to $(\Delta S_2 - \Delta S_1)$. In other words, $\Delta H_2 = \Delta H_1 + (\Delta S_2 - \Delta S_1)$.

Accordingly, as shown in FIG. 3(c), the Z position of the bonding point (sinking-in Z position $S_2$), when the bonding tool 10 is lowered and bonding of the first wire to the end-portion bonding point $P_2$ is performed, is stored as the reference bonding position $S_2$ in the same manner as described above. Then, when bonding to the bonding point $P_2$ is completed, the raised position $C_2$ and the raising amount $\Delta H_2$ used for looping are calculated by the Z position operational processor 26 on the basis of looping parameters stored in the memory 23 beforehand, using the reference bonding position $S_2$ stored in the memory 23 as a reference. Here, as shown in FIG. 7, the raising amount $\Delta H_2$ is obtained by adding the sinking-in amount $\Delta S_2$ to the fixed amount $\Delta H_0$, and the bonding tool 10 is raised by this raising amount $\Delta H_2$. Afterward, using a universally known method, the bonding tool 10 is moved to the second bonding point and performs bonding, after which the wire 11 is cut from the second bonding point.

Subsequently, after the bonding of each wire to the corresponding bonding point, the raising of the bonding tool 10 is accomplished as follows: i.e., using the reference bonding position $S_2$ stored in the memory 23 as a reference, the bonding tool is raised by an amount $\Delta Hn$ which is obtained by adding the raising amount $\Delta H_2$ to the difference $\Delta S$ between the sinking-in amount $\Delta S_2$ at this reference bonding position $S_2$ and the sinking-in amount $\Delta Sn$ at the bonding points Pn from the second wire on. For example, in the case of bonding to the central-portion bonding point $P_1$, as shown in FIG. 3(b), the bonding tool 10 is raised (following bonding to the bonding point $P_1$) by a raising amount $\Delta H_1$ obtained by adding the raising amount $\Delta H_2$ to the difference $\Delta S$ on the basis of looping parameters stored beforehand in the memory 23, using the reference bonding position $S_2$ stored in the memory 23 as a reference. In other words, the sinking-in amount in this case is $\Delta S_1$ and the bonding tool is raised from the sinking-in Z position $S_1$; therefore, the raising amount $\Delta H_1$ from the sinking-in Z position $S_1$ is $\Delta H_1 = \Delta H_2 - (\Delta S_2 - \Delta S_1)$.

As seen from the above, in the present invention the bonding tool is raised using the sinking-in Z position $S_2$ of the bonding point $P_2$ of the first wire (i.e., the first bonding point) as a reference bonding position $S_2$; accordingly, when the bonding tool 10 is raised so that the application of pressure by the bonding tool 10 is eliminated and the bonding point on the semiconductor chip 8 returns to the pro-sinking-in position $C_2$ as shown in FIG. 3(c), the raised position of the bonding tool 10 which is raised from the bonding point for looping will always be the same position $C_2$ regardless of the bonding point. As a result, the same loop height and shape can be obtained at all of the bonding points.

Furthermore, the storage of the reference bonding position in the memory 23 must be performed for each semiconductor chip 8, since the height of the bonding point in the state in which the bonding tool 10 exerts no pressing force varies according to the semiconductor chip 8. In the respective embodiment described above, the bonding point of the first wire is a central-portion bonding point $P_1$ or end-portion bonding point $P_2$; however, it goes without saying that any arbitrary bonding point Pn may be used.

As seen from the above, in the present invention, after a bonding (or looping) of the first pair of bonding points is completed by a wire (the first wire), the movement amount of the bonding tool 10 for all of the remaining pairs of bonding points is obtained by the Z-position operational processor 26 and stored in the memory 23, so that such a stored movement amount is successively read out so as to move the bonding tool 10 for bonding (or looping) the remaining bonding points.

However, in the present invention, the above-described storing of the movement amount of the tool 10 for the remaining bonding point can be omitted; and in this case, the movement amount of the tool 10 for each one of the remaining bonding points after bonding of the first pair of bonding points is obtained by the Z-position operational processor 26, and the tool 10 is moved in accordance with such an obtained movement amount which is not stored in the memory 23.

Figure 8:
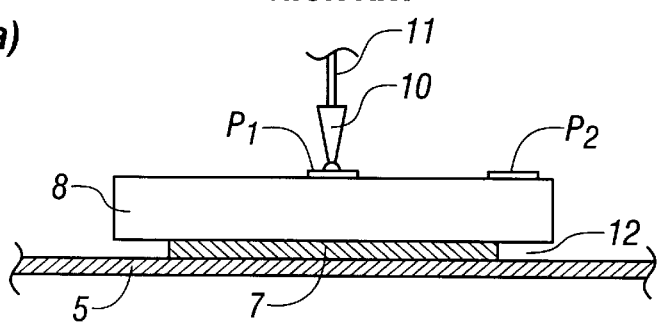
Figure 8:
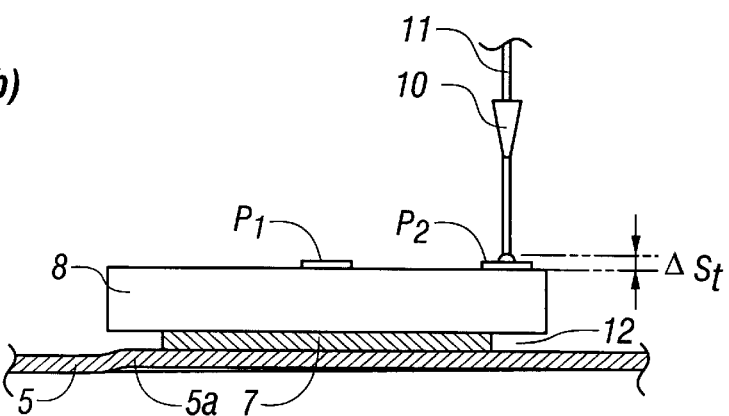
Figure 8:
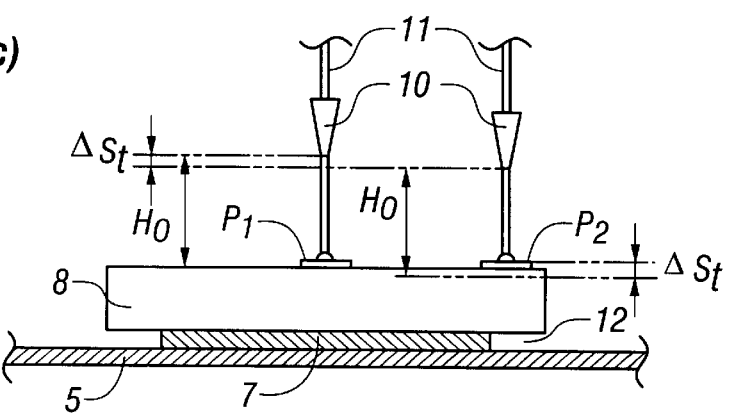

Furthermore, in the respective above embodiment, an insulating sheet 6 is employed. However, it goes without saying that the present invention can be used in the system shown in FIG. 8, which has no insulating sheet 6. In addition, the bonding tool 10 is not necessarily a capillary; and it goes without saying that the present invention can be used in cases where a wedge is employed. Moreover, in cases where there is sinking-in on the side of the second bonding point as a result of the pressure applied by the bonding tool 10, the present invention can also be applied to the second bonding point. Furthermore, in the above embodiments, the wire 11 is passed through the bonding tool 10 and the reference bonding position is detected; however, it is also possible to use the position in the direction of the Z axis when the tip end of the bonding tool 10 is caused to contact an arbitrary point (including bonding points) on the semiconductor device directly as the reference bonding point.

In the present invention, the reference bonding point is not limited to the bonding point of the first wire, but may be an arbitrary bonding point. In such a case, prior to the initiation of bonding, the sinking-in Z position Sx when the bonding tool 10 drops and performs bonding on the arbitrary bonding point that is to be used as the reference bonding point is detected, and this sinking-in Z position Sx is used as the reference bonding position. Furthermore, it would also be possible to use the average value for several measurement results as the reference bonding position.

Furthermore, the detection of Z-direction positions of bonding points on the semiconductor chip 8 includes any inclination of the semiconductor chip 8 or thickness of the crushed ball or wire after bonding. As a result, the position of the bonding tool 10 in the direction of the Z axis following bonding at the reference bonding position on the semiconductor chip 8 (i.e., the bonding point of the first wire or an arbitrary bonding point) varies according to the above-described inclination and thickness. Strictly speaking, therefore, the position $S_0$ is not a single numerical value but consists of n values equal to the number of bonding points. However, the range of variation encompassing these elements is approximately 5 microns, which can be ignored relative to the permissible variation in the wire height following bonding (approximately 50 microns). Accordingly, the position $S_0$ may be treated as a single value.

As seen from the above, according to the present invention, when the bonding tool is raised following bonding to bonding points on a semiconductor chip, an arbitrary bonding point is taken as a reference bonding point so that the amount by which the bonding tool is raised from this reference bonding point is fixed. Accordingly, a fixed loop height and loop shape can be obtained regardless of the position where bonding is performed on the semiconductor chip.

What is claimed is:

1. A wire bonding apparatus comprising a Z-axis motor for raising and lowering a bonding tool through which a wire is passed, and a motor controller which outputs commands that drive said Z-axis motor, so that a first bonding point and a second bonding point on a semiconductor chip are connected by a wire, said apparatus further comprising of:

a bonding position detection sensor which inputs positions of bonding points, a memory which stores a plurality of bonding positions and looping parameters, said looping parameters comprising a raising amount for each of said plurality of bonding positions and a sinking in amount for each of said plurality of bonding positions, a Z-position operational processor which calculates an amount of raising of said bonding tool based upon a bonding position used as a reference among a plurality of bonding positions stored in said memory, and said looping parameters, and a main controller which controls said Z-axis motor controller based upon an amount of raising of said bonding tool supplied from said Z-position operational processor whereby a wire loop of a same height and shape is obtained at each of said plurality of bonding positions.

2. The wire bonding apparatus of claim 1 wherein said Z-position operational processor calculates the amount of raising of said bonding tool at each of said plurality of bonding positions by adding a raising amount of a previous one of said plurality of bonding positions to a difference between a sink in amount at a next one of said plurality of bonding positions and a sinking in a mount at said previous one of said plurality of bonding positions.

* * * * *